US010418454B2

(12) United States Patent
Li et al.

(10) Patent No.: US 10,418,454 B2
(45) Date of Patent: Sep. 17, 2019

(54) SEMICONDUCTOR DEVICE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: Yong Li, Shanghai (CN); Zhongshan Hong, Shanghai (CN)

(73) Assignees: SEMICONDUCTOR MANUFACTURING INTL. (SHANGHAI) CORP., Shanghai (CN); SEMICONDUCTOR MANUFACTURING INTL. (BEIJING) CORP., Beijing (CN)

( * ) Notice: Subject to any disclaimer, the term of this patent is extended or adjusted under 35 U.S.C. 154(b) by 0 days.

(21) Appl. No.: 15/973,711

(22) Filed: May 8, 2018

(65) Prior Publication Data

US 2018/0337243 A1 Nov. 22, 2018

(30) Foreign Application Priority Data

May 18, 2017 (CN) .......................... 2017 1 0350094

(51) Int. Cl.
| | | |
|---|---|---|
| H01L 29/04 | (2006.01) |
| H01L 29/423 | (2006.01) |
| H01L 27/088 | (2006.01) |
| H01L 29/08 | (2006.01) |
| H01L 21/28 | (2006.01) |
| H01L 21/8234 | (2006.01) |

(52) U.S. Cl.
CPC .. *H01L 29/42368* (2013.01); *H01L 21/28211* (2013.01); *H01L 21/823418* (2013.01); *H01L 21/823431* (2013.01); *H01L 21/823462* (2013.01); *H01L 27/0886* (2013.01); *H01L 29/0847* (2013.01)

(58) Field of Classification Search
CPC ..................... H01L 27/0886; H01L 29/0847
See application file for complete search history.

(56) References Cited

U.S. PATENT DOCUMENTS

2006/0027870 A1* 2/2006 Inaba ................... H01L 27/1203
257/353
2018/0331097 A1* 11/2018 Zang ................. H01L 29/66666

* cited by examiner

*Primary Examiner* — Caridad Everhart
*Assistant Examiner* — Ankush K Singal
(74) *Attorney, Agent, or Firm* — Brinks Gilson & Lione

(57) ABSTRACT

This disclosure relates to the technical field of semiconductors, and discloses a semiconductor device and a manufacturing method therefor. The semiconductor device may include a substrate; a first fin on the substrate for forming a first electronic component; a first gate structure on a portion of the first fin including a first gate dielectric layer on a portion of the first fin and a first gate on the first gate dielectric layer; and a first source region and a first drain region that each at one of two sides of the first gate structure and at least partially located in the first fin, where the first gate dielectric layer comprises a first region abutting against the first drain region, a second region abutting against the first source region, and a third region between the first region and the second region, and wherein thickness of the first region is greater than that of the third region.

20 Claims, 12 Drawing Sheets

SEMICONDUCTOR DEVICE AND MANUFACTURING METHOD THEREFOR

RELATED APPLICATIONS

The present application claims priority to Chinese Patent Application No. 201710350094.9, filed on May 18, 2017, the entire disclosure of which is hereby incorporated by reference.

BACKGROUND

Technical Field

This disclosure relates to the technical field of semiconductors, and in particular, to a semiconductor device and a manufacturing method therefor.

Related Art

As critical dimensions of a metal oxide semiconductor field effect transistor (MOSFET) decrease, the short channel effect (SCE) becomes more serious. A fin field effect transistor (FinFET) has improved gate control capabilities, and can effectively reduce the SCE.

However, for some FinFET electronic components, such as an input/output (I/O) electronic component, a gated-induce drain leakage (GIDL) is relatively large. Therefore, reliability of such electronic components may be affected.

SUMMARY

An objective of this disclosure is to decrease GIDL of an electronic component.

In one implementation, a semiconductor device is disclosed. The semiconductor device includes a substrate; a first fin that is on the substrate for forming a first electronic component; a first gate structure on a portion of the first fin including a first gate dielectric layer on a portion of the first fin and a first gate on the first gate dielectric layer; and a first source region and a first drain region, each of which is positioned at one of two sides of the first gate structure and at least partially located in the first fin, wherein the first gate dielectric layer includes a first region abutting against the first drain region, a second region abutting against the first source region, and a third region between the first region and the second region, and wherein a thickness of the first region is greater than a thickness of the third region.

In some implementations, a thickness of the second region is greater than the thickness of the third region.

In some implementations, the first gate dielectric layer includes a first dielectric layer above a portion of the first fin; a first high-K dielectric layer above the first dielectric layer; and a first oxide layer including a first portion below edges of the first dielectric layer and the first gate structure.

In some implementations, the first oxide layer further includes a second portion below the first dielectric layer and positioned between the edges of the first dielectric layer and the first gate structure, wherein the thickness of the first portion is greater than the thickness of the second portion.

In some implementations, the first oxide layer further includes a third portion at upper edges of the first dielectric layer and the first gate structure.

In some implementations, the first oxide layer further includes a fourth portion on a portion on an upper side of a portion of the first dielectric layer and positioned between the edges of the first dielectric layer and the first gate structure, wherein the thickness of the third portion is greater than a thickness of the fourth portion.

In some implementations, the semiconductor device further includes a second fin on the substrate for forming a second electronic component; a second gate structure on a portion of the second fin including a second gate dielectric layer on a portion of the second fin and a second gate on the second gate dielectric layer; and a second source region and a second drain region, each of which is positioned at one of two sides of the second gate structure and at least partially located in the second fin.

In some implementations, the second gate dielectric layer includes a second high-K dielectric layer.

In some implementations, the first electronic component includes an input/output electronic component, and the second electronic component includes a kernel electronic component. The kernel electronic components may operate at a different gate voltage (e.g., lower voltage) compared to the I/O electronic component.

A method for manufacturing a semiconductor device is provided in this disclosure, including providing a substrate structure, wherein the substrate structure comprises a substrate, a first fin that is on the substrate for forming a first electronic component, and a first pseudo gate structure on a portion of the first fin. The first pseudo gate structure may include a first dielectric layer on a portion of the first fin, a first pseudo gate on the first dielectric layer, a first hard mask layer on the first pseudo gate, and a first spacer layer located at side walls of the first pseudo gate and the first hard mask layer. The method may further include performing an oxidization process, so as to oxidize the first fin below edges of the first dielectric layer and the first pseudo gate structure, thereby forming a first portion of a first oxide layer; performing an etching process after the oxidization process is performed, so as to remove a portion of the first fin that is at a side surface of the first pseudo gate structure, thereby forming a first recess and a second recess; and performing an epitaxial process, so as to epitaxially grow a semiconductor material in the first recess and the second recess, thereby forming a first source region and a first drain region.

In some implementations, the oxidization process further oxidizes oxidizes the first fin that is below a portion between the edges of the first dielectric layer and the first pseudo gate structure, so as to form a second portion of the first oxide layer, wherein thickness of the first portion is greater than that of the second portion.

In some implementations, the oxidization process further oxidizes the first pseudo gate at the edges of the first dielectric layer and the first pseudo gate structure, so as to form a third portion of the first oxide layer.

In some implementations, the oxidization process further oxidizes the first pseudo gate that is on upper side of a portion of the first dielectric layer and between the edges of the first dielectric layer and the first pseudo gate structure, so as to form a fourth portion of the first oxide layer, and wherein thickness of the third portion is greater than that of the fourth portion.

In some implementations, the oxidization process includes a rapid thermal oxidization process, a furnace oxidization process, or an in-situ steam generation process.

In some implementations, the method further includes depositing an interlayer dielectric layer and performing planarization after the epitaxial process is performed, so as to expose the first pseudo gate; removing the first pseudo gate, so as to form a first groove for forming the first electronic component; forming a first high-K dielectric layer at a bottom portion of the first groove; and forming a first gate on the first high-K dielectric layer, wherein the first dielectric layer, the first oxide layer, and the first high-K dielectric layer serve as a first gate dielectric layer for the first gate.

In some implementations, the substrate structure further includes a second fin on the substrate for forming a second electronic component and a second pseudo gate structure on a portion of the second fin, the second pseudo gate structure comprising a second dielectric layer on a portion of the second fin, a second pseudo gate on the second dielectric layer, a second hard mask layer on the second pseudo gate, and a second spacer layer located at side walls of the second pseudo gate and the second hard mask layer; the oxidization process further oxidizes the second fin below edges of the second dielectric layer and the second pseudo gate structure, so as to form a second oxide layer; the etching process further removes a portion of the second fin at a side surface of the second pseudo gate structure, so as to form a third recess and a fourth recess; and the epitaxial process further epitaxially grows a semiconductor material in the third recess and the fourth recess, so as to form a second source region and a second drain region.

In some implementations, the method further includes: depositing an interlayer dielectric layer and performing planarization after the epitaxial process is performed, so as to expose the first pseudo gate and the second pseudo gate; removing the first pseudo gate and the second pseudo gate, so as to form a first groove for forming the first electronic component and a second groove for forming the second electronic component; removing the second dielectric layer and the second oxide layer; forming a first high-K dielectric layer at a bottom portion of the first groove, and forming a second high-K dielectric layer at a bottom portion of the second groove; and forming a first gate on the first high-K dielectric layer, and forming a second gate on the second high-K dielectric layer, wherein the first dielectric layer, the first oxide layer, and the first high-K dielectric layer serve as a first gate dielectric layer for the first gate, and the second high-K dielectric layer serves as a second gate dielectric layer for the second gate.

In some implementations, the first electronic component includes an input/output electronic component, and the second electronic component includes a kernel electronic component.

In the semiconductor device provided in this application, the thickness of a first region at which a first gate dielectric layer abuts against a first drain region is greater than that of an intermediate third region. That is, the thickness of the first gate dielectric layer between overlapping portions of the first drain region and the first gate in increased, so as to reduce a vertical electric-field strength, and decrease GIDL of an electronic component.

The exemplary implementations are described in detail below with reference to the accompanying drawings.

BRIEF DESCRIPTION OF THE DRAWINGS

The accompanying drawings which constitute a part of the specification illustrate exemplary implementations of this disclosure and, together with the specification, serve to explain the principles of this disclosure. In the accompanying drawings.

DETAILED DESCRIPTION

Exemplary implementations are described in detail with reference to the accompanying drawings. It should be understood that unless otherwise specified, relative layouts, mathematical expressions, and numeric values of components and steps described in these implementations should not be understood as a limitation to the scope of this disclosure.

In addition, it should be understood that for ease of description, sizes of the components shown in the accompanying drawings are not necessarily drawn according to an actual proportional relationship. For example, thicknesses or widths of some layers may be magnified with respect to other layers.

The following descriptions of the exemplary implementations are only illustrative, and would not be used as any limitation on the scope of this disclosure and on the applications or uses of this disclosure in any sense.

Technologies, methods, and devices that are known by a person of ordinary skill in the related fields may not be discussed in detail. However, in cases where these technologies, methods, and devices are applicable, these technologies, methods, and devices should be considered as part of the specification.

It should be noted that similar reference signs, labels, and letters represent similar items in the following accompanying drawings. Therefore, once an item is defined or described in a figure, the item does not need to be further discussed in the descriptions of the subsequent figures.

Undesirable Gated-induce drain leakage (GIDLs) of some FinFET electronic components (also referred to as electronic components) may be large. Particularly, in existing manufacturing processes, a gate dielectric layer at a top portion of a fin is relatively thin, but supply voltages supplied by some devices in operation are relatively high. For example, a supply voltage of an I/O electronic component is 1.8V. Therefore, electric field lines at the top portion of the fin are relatively dense, and an electric field is relatively large. As a result, the GIDL of such an electronic component is relatively large. This disclosure provides the following solutions to this problem.

Figure 1:
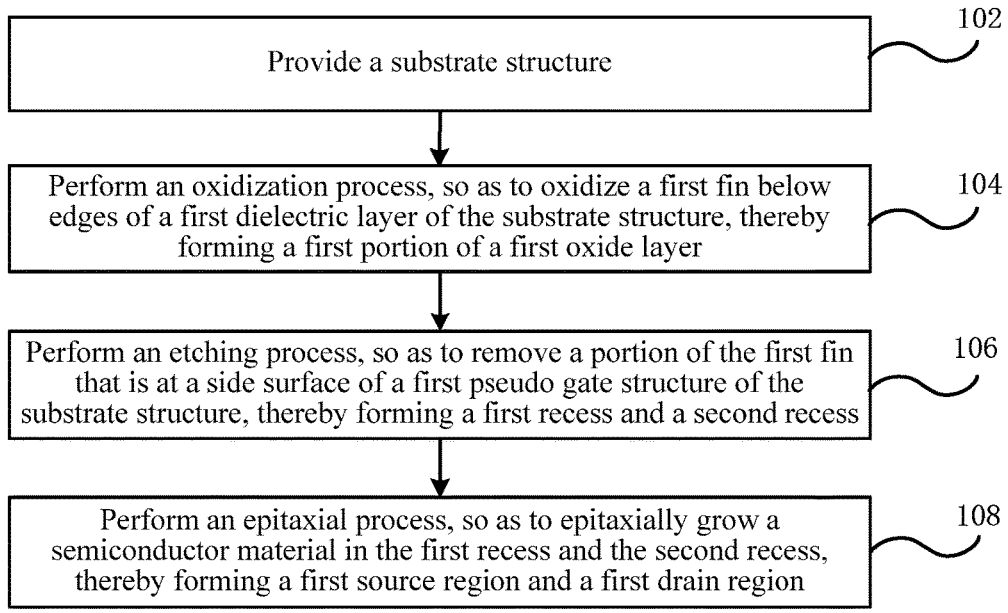
FIG. 1 is a simplified flowchart of a method for manufacturing a semiconductor device.

FIG. 1 is a simplified flowchart of a method for manufacturing a semiconductor device. FIG. 2A to FIG. 6B show schematic diagrams at all phases of the method for manufacturing the semiconductor device. The method is described in detail below with reference to FIG. 1 and FIG. 2A to FIG. 6B.

As shown in FIG. 1, first, in step 102, a substrate structure is provided.

Figure 2A:
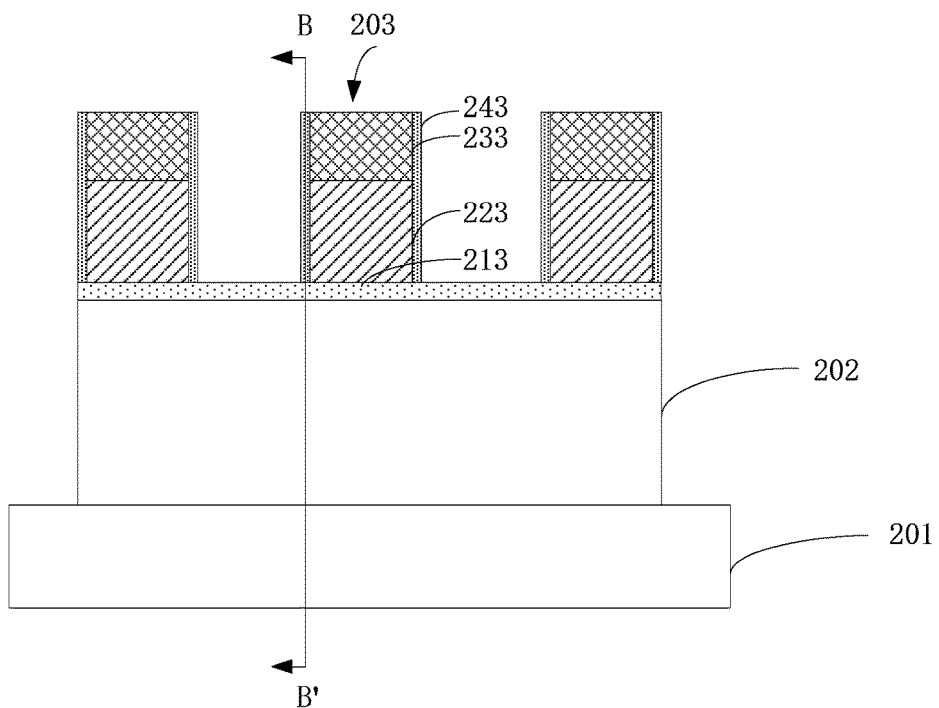
FIG. 2A to FIG. 6B show schematic diagrams at all phases of a method for manufacturing a semiconductor device.
Figure 2B:
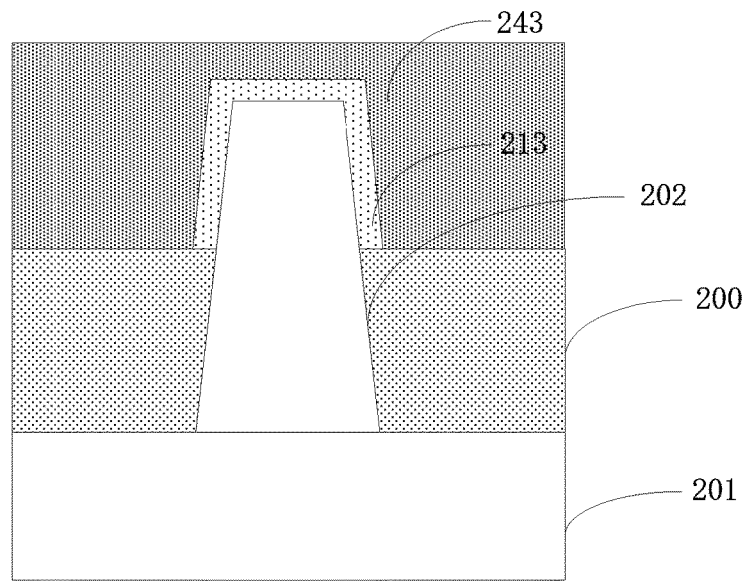

FIG. 2A shows a schematic diagram of a substrate structure. FIG. 2B is a cross-sectional diagram along B-B' shown in FIG. 2A. As shown in FIG. 2A and FIG. 2B, the substrate structure may include a substrate 201, a first fin 202 on the substrate 201 for forming a first electronic component, and a first pseudo gate structure 203 on a portion of the first fin 202. Herein, the first electronic component may be, for example, an I/O electronic component. However, this disclosure is not limited thereto. For example, the first electronic component may also be an electrostatic discharge (ESD) protection electronic component or an LDMOS (laterally-diffused metal oxide semiconductor) electronic component.

The first pseudo gate structure 203 may include a first dielectric layer 213 on a portion of the first fin 202 and include a first pseudo gate 223 on the first dielectric layer 213. In addition, the first pseudo gate structure 203 may also include a first hard mask layer 233 on the first pseudo gate 223 and include a first spacer layer 243 at side walls of the first pseudo gate 223 and the first hard mask layer 233.

The substrate 201 may be, for example, a silicon substrate, or a semiconductor substrate made of a III-V group material. The material of the first fin 202 may be a semiconductor material that is the same as the material of the substrate 201, or may be a semiconductor material that is different from the material of the substrate 201. The first pseudo gate 223 may comprise, for example, polysilicon. The first hard mask layer 233 typically may comprise a nitride of silicon, an oxide of silicon, or a nitrogen oxide of silicon. The first spacer layer 243 may comprise, for example, a nitride of silicon.

It should be noted that another pseudo gate structure may be formed at one or two end portions of the first fin 202. The pseudo gate structure may be the same as the first pseudo gate structure 203, with reference to FIG. 2A. The pseudo gate structure helps to subsequently control appearances of a first source region 207 and a first drain region 208 that are epitaxially formed (see, e.g., FIG. 6A).

It should also be noted that, as shown in FIG. 2B, the substrate structure may further include an isolation structure 200, for example, a shallow trench isolation (STI) structure, at a side surface of the first fin 202. The isolation structure exposes a portion of the first fin 202. It can be seen from FIG. 2B that the first dielectric layer 213 is formed at a surface of a portion of the first fin 202 above the isolation structure 200.

Figure 3A:
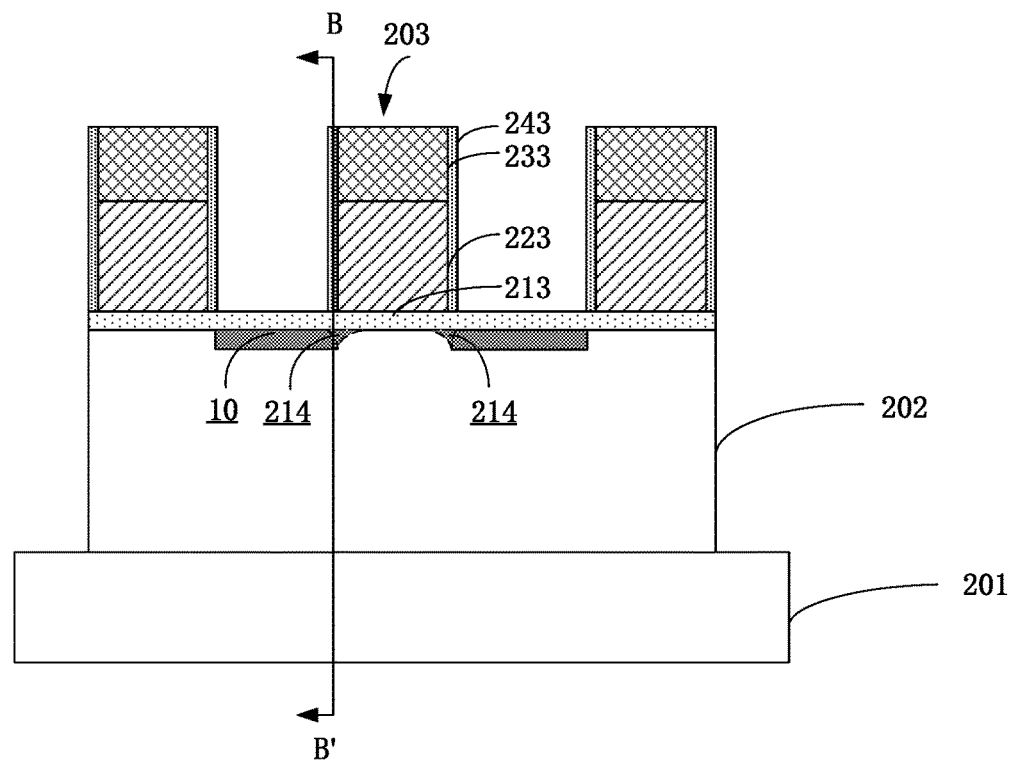
Figure 3B:
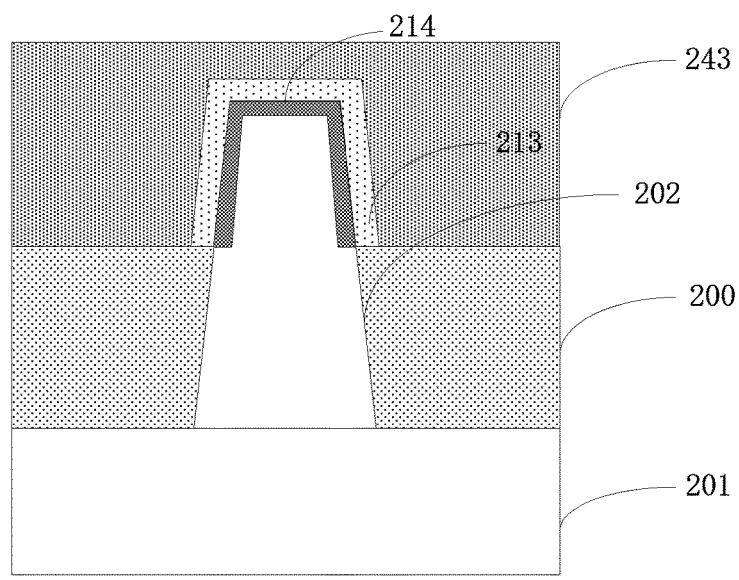

Subsequently, in step 104, an oxidization process is performed, so as to oxidize a surface of the first fin 202 below edges of the first dielectric layer 213 and the first pseudo gate structure 203, thereby forming a first portion 214 of a first oxide layer, as shown in FIG. 3A and FIG. 3B. FIG. 3B is a cross-sectional diagram along B-B' shown in FIG. 3A.

In some implementations, the oxidization process may include, but is not limited to, a rapid thermal oxidization (RTO) process, a furnace oxidization process, or an in-situ steam generation (ISSG) process. After the oxidization process, the first portion 214 of the first oxide layer is formed at the edges of the first dielectric layer 213, that is, below a portion close to the first spacer layer 243. It should be understood that the oxidization process further forms an oxide layer 10 at a surface of a portion of the first fin 202 not covered by the first pseudo gate structure 203, that is, a portion abutting against the first portion 214 shown in FIG. 3A.

In another implementation, with reference to FIG. 4A, the oxidization process may further oxidize the first fin 202 that is below a portion between two edges of the first dielectric layer 213 and the first pseudo gate structure, so as to form a second portion 224 of the first oxide layer. The first oxide layer in this implementation may include the first portion 214 and the second portion 224. The thickness of the first portion 214 is greater than that of the second portion 224.

Figure 4A:
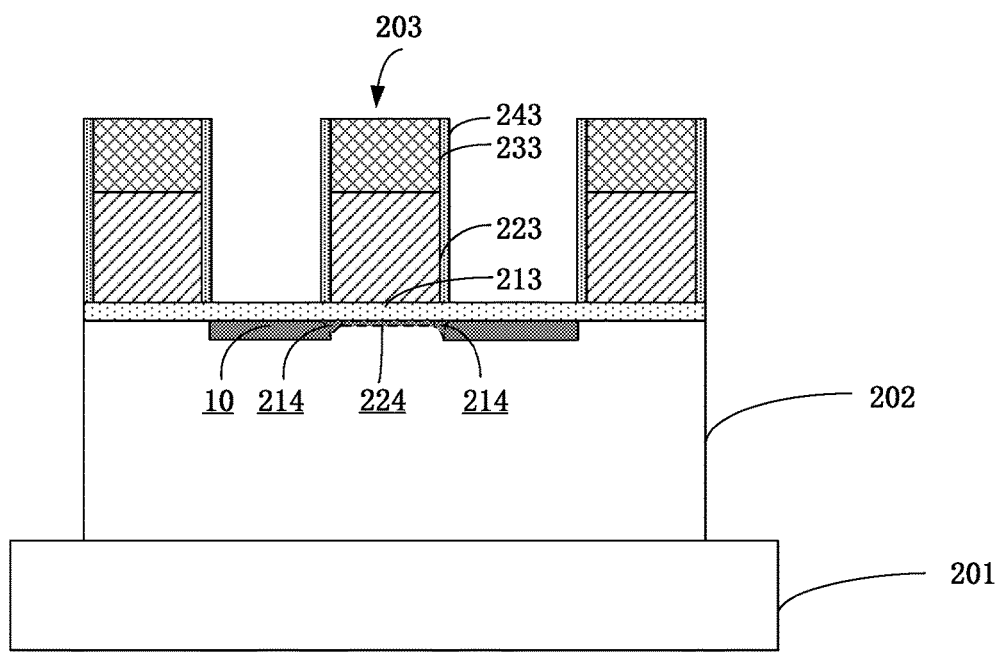
Figure 4B:
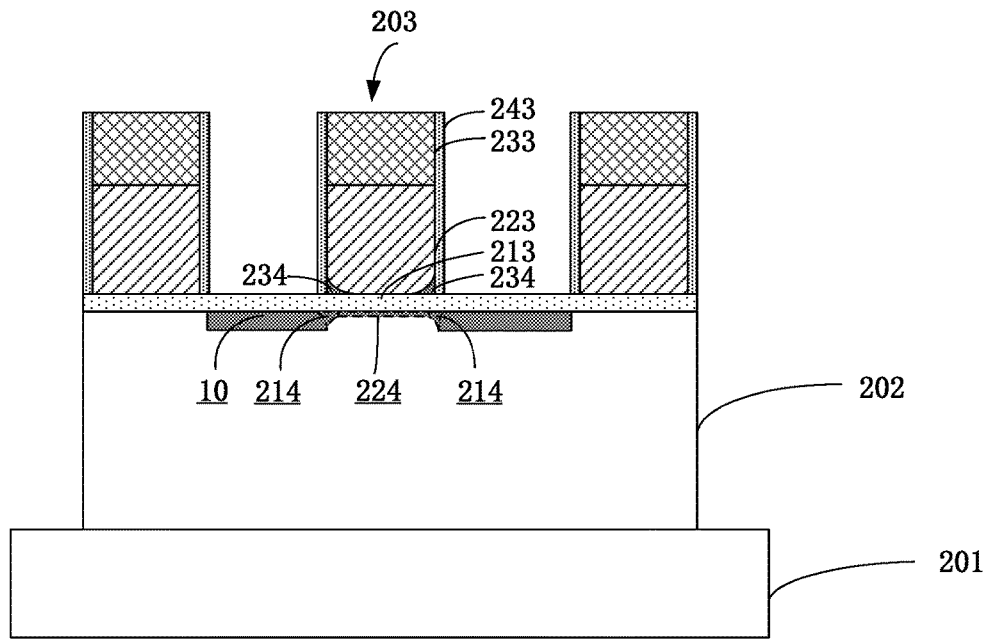

In still another implementation, with reference to FIG. 4B, the oxidization process may further oxidize the first pseudo gate 223 at the upper edges of the first dielectric layer 213 and the first pseudo gate structure 203, so as to form a third portion 234 of the first oxide layer. The first oxide layer in this implementation may include the first portion 214, the second portion 224, and the third portion 234, or include the first portion 214 and the third portion 234.

Figure 4C:
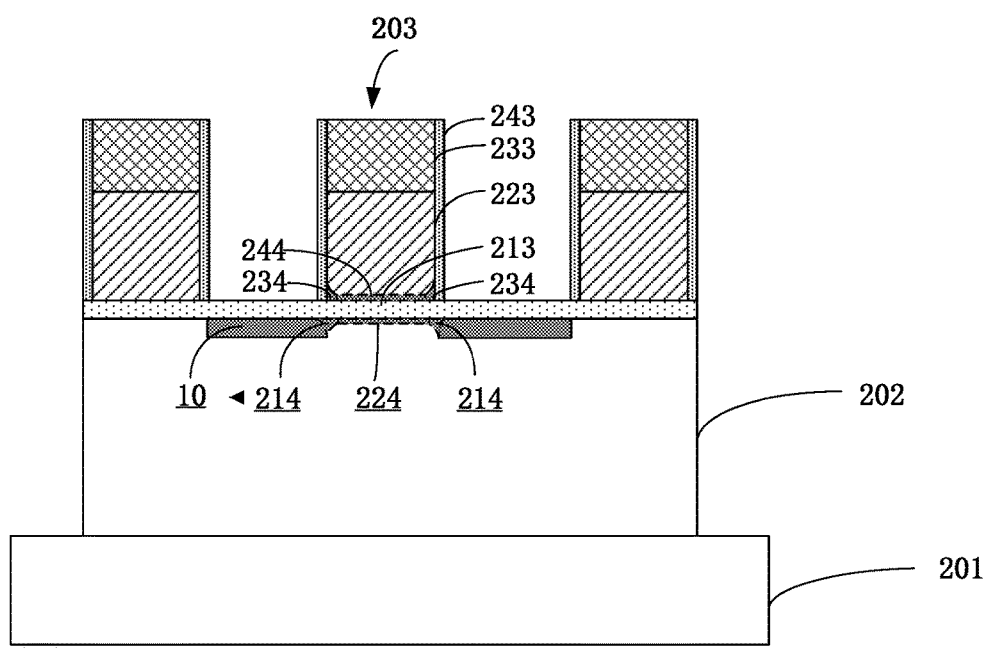

In yet another implementation, with reference to FIG. 4C, the oxidization process may further oxidize the first pseudo gate 223 that is on the portion between the two upper edges of the first dielectric layer 213 and the first pseudo gate structure 203, so as to form a fourth portion 244 of the first oxide layer. Herein, the thickness of the third portion 234 is greater than that of the fourth portion 244. The first oxide layer in this implementation may include the first portion 214, the second portion 224, the third portion 234, and the fourth portion 244. Alternatively, the first oxide layer may include the first portion 214, the third portion 234, and the fourth portion 244.

It should be noted that the subsequent processes performed according to FIG. 4A, FIG. 4B, and FIG. 4C merely differ from the subsequent process performed according to FIG. 3A in differences of the first oxide layer. Therefore, the subsequent processes are described below by merely using FIG. 3A as an example.

Figure 5A:
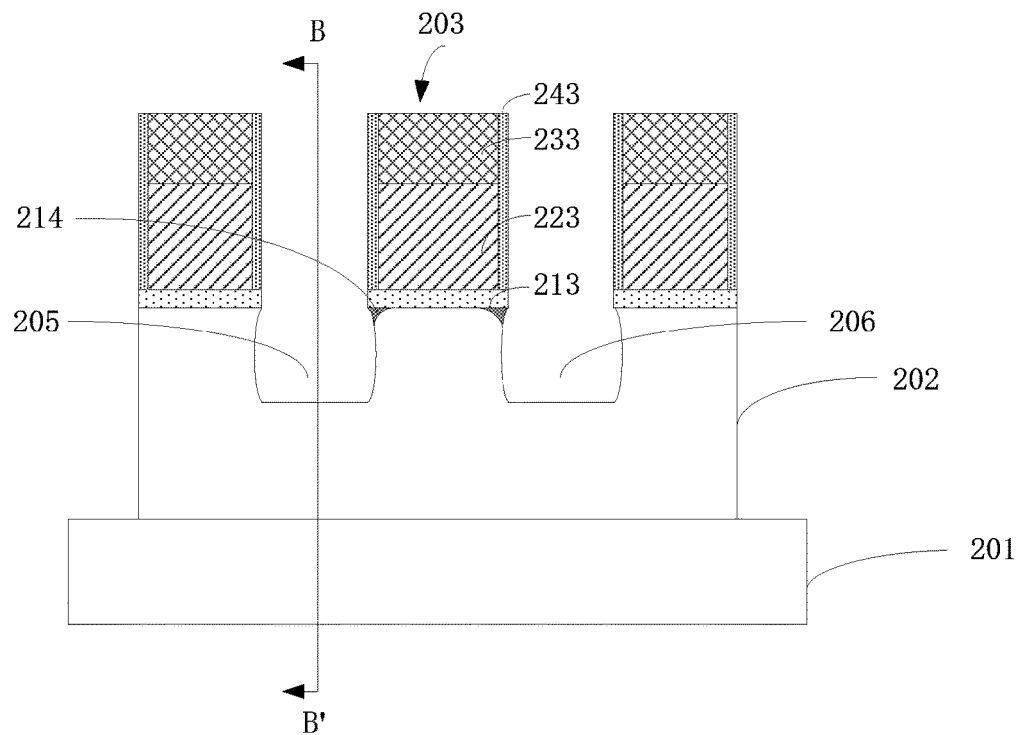
Figure 5B:
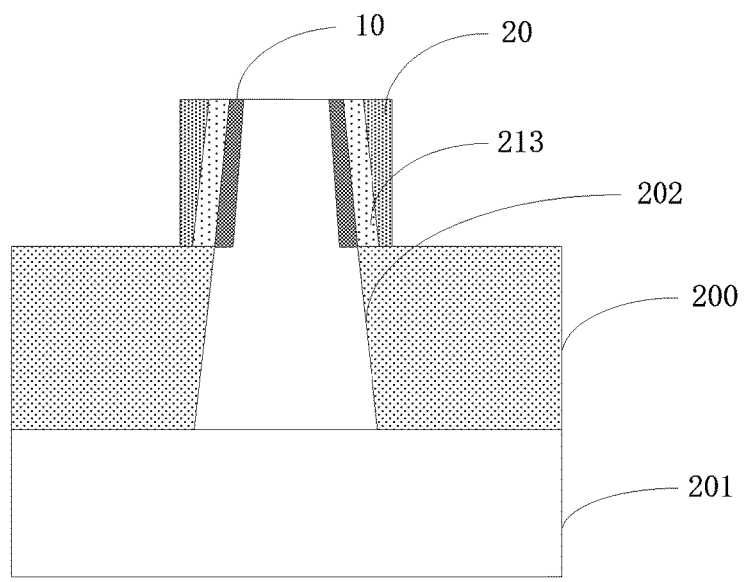

Subsequently, in step 106, an etching process is performed, so as to remove a portion of the first fin 202 that is at a side surface of the first pseudo gate structure 203, thereby forming a first recess 205 and a second recess 206, as shown in FIG. 5A and FIG. 5B. FIG. 5B is a cross-sectional diagram along B-B' shown in FIG. 5A. In addition, although FIG. 5B shows that the first dielectric layer 213 at the side surface of the first fin 202 is provided with a mask layer 20, it should be understood that this is not necessary. In other implementations, the first dielectric layer 213 at the side surface of the first fin 202 may not be provided with the mask layer 20.

Figure 6A:
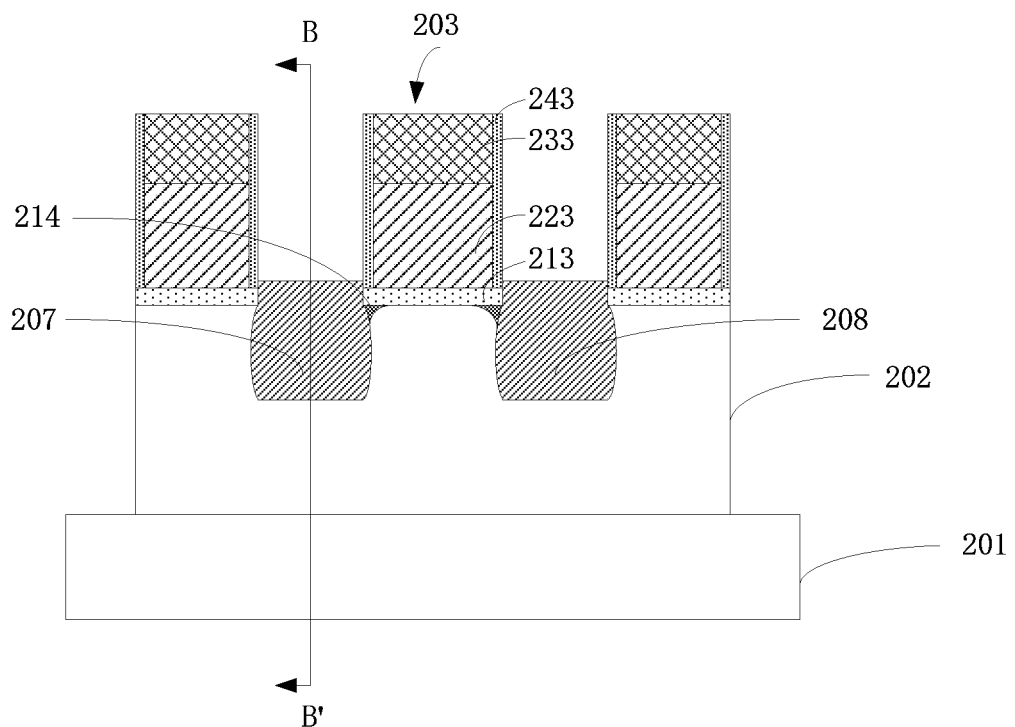
Figure 6B:
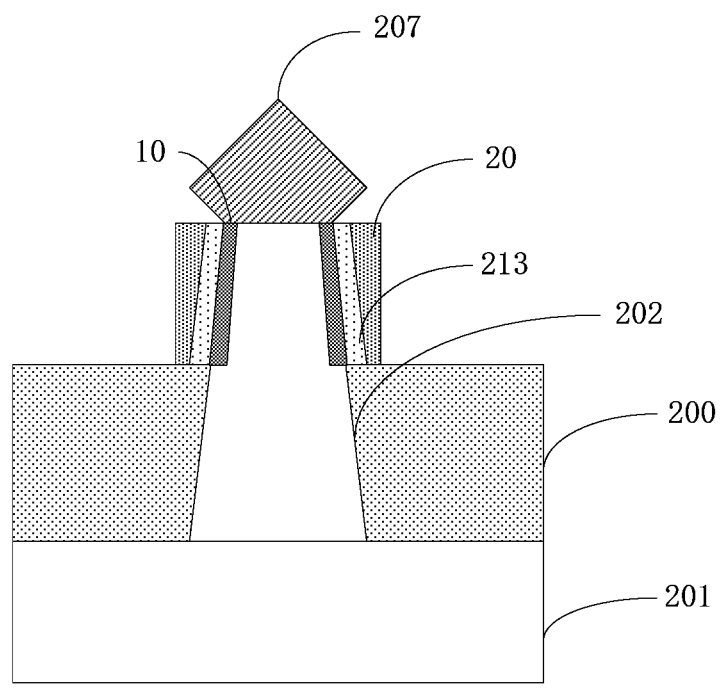

Subsequently, in step 108, an epitaxial process is performed, so as to epitaxially grow a semiconductor material in the first recess 205 and the second recess 206, thereby forming a first source region 207 and a first drain region 208, as shown in FIG. 6A and FIG. 6B. FIG. 6B is a cross-sectional diagram along B-B' shown in FIG. 6A.

In some implementations, the first electronic component may be a PMOS electronic component, and the epitaxial semiconductor material may be SiGe. In another implementation, the first electronic component may be an NMOS electronic component, the epitaxial semiconductor material may be Si, and P may be in-situ doped in a process of epitaxial growth of Si.

A method for manufacturing a semiconductor device is described above. The method may include: performing an oxidization process after a first spacer layer is formed, so as to form, below edges of a first dielectric layer with the spacer, a first portion of a first oxide layer. The first dielectric layer and the first portion of the first oxide layer below the edges of the first dielectric layer serve as a gate dielectric layer for a pseudo gate. Thickness of the gate dielectric layer between overlapping portions of a first drain region and a first pseudo gate is increased, so as to reduce a vertical electric-field strength, and decrease GIDL.

After the first source region 207 and the first drain region 208 are formed, the first pseudo gate 223 may further be replaced with, for example, a metal gate. Another method for manufacturing a semiconductor device is described with reference to FIG. 7A to FIG. 10.

Figure 7A:
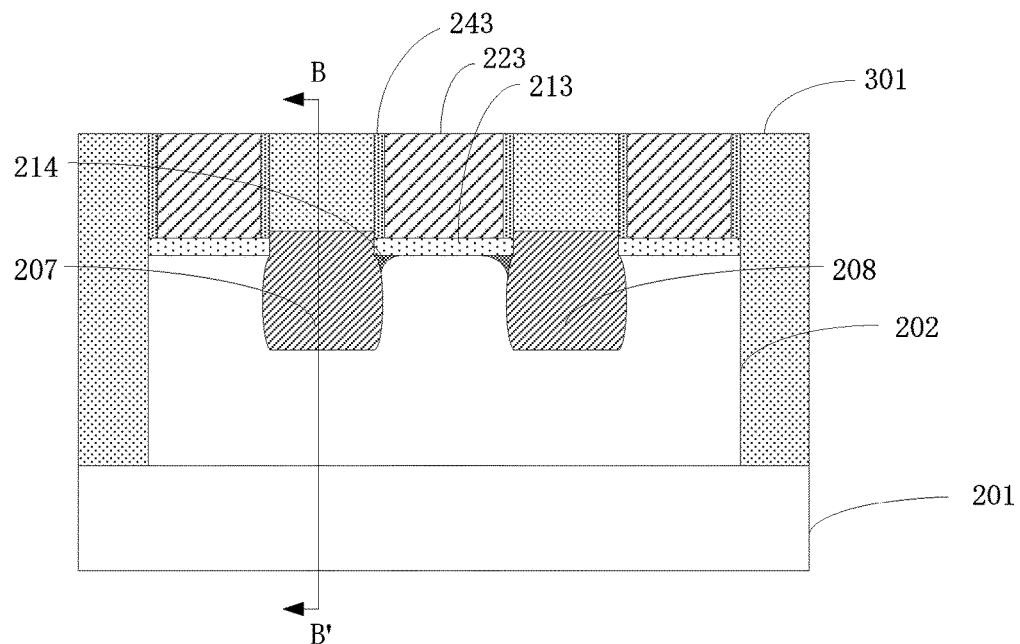
FIG. 7A to FIG. 10 show schematic diagrams at all phases of another method for manufacturing a semiconductor device.
Figure 7B:
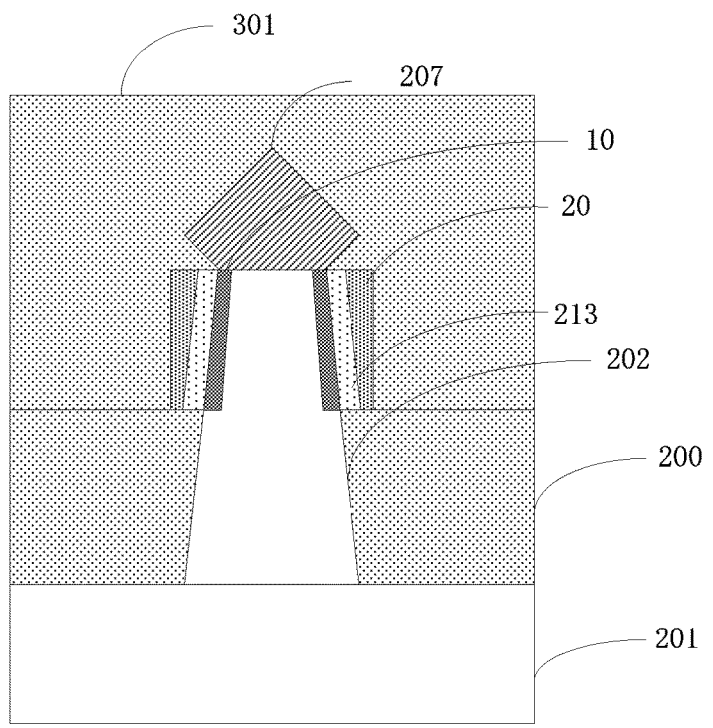

First, as shown in FIG. 7A and FIG. 7B, an interlayer dielectric layer 301 is deposited, and planarization, for example, chemical mechanical planarization (CMP), is performed, so as to expose the first pseudo gate 223.

Figure 8:
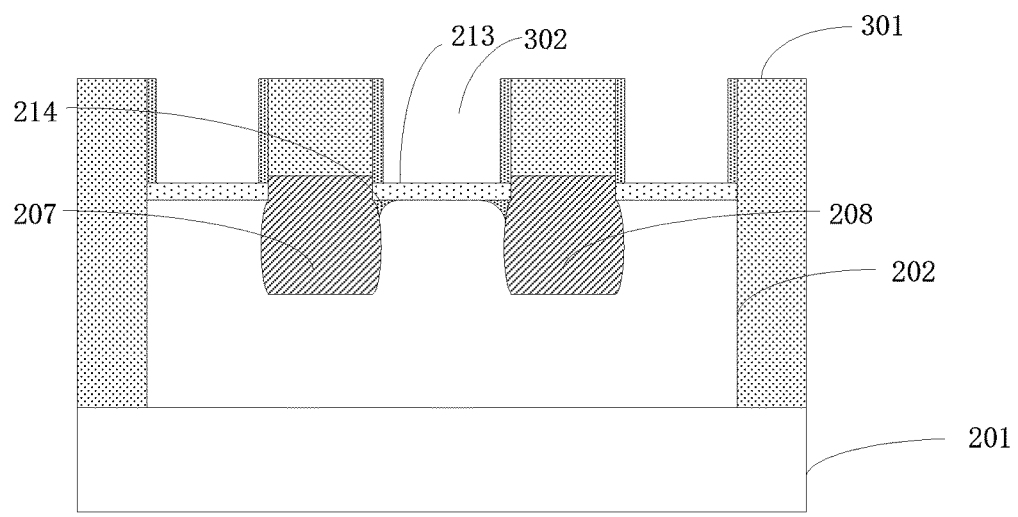

Subsequently, as shown in FIG. 8, the first pseudo gate 223 is removed, so as to form a first groove 302 applied to the first electronic component. Herein, the pseudo gates in the pseudo gate structures at the end portions of the first fin 202 may also be removed when the first pseudo gate 223 is removed. Alternatively, only the first pseudo gate 223 is removed, and the pseudo gates in the pseudo gate structures at the end portion of the first fin 202 is retained.

Figure 9:
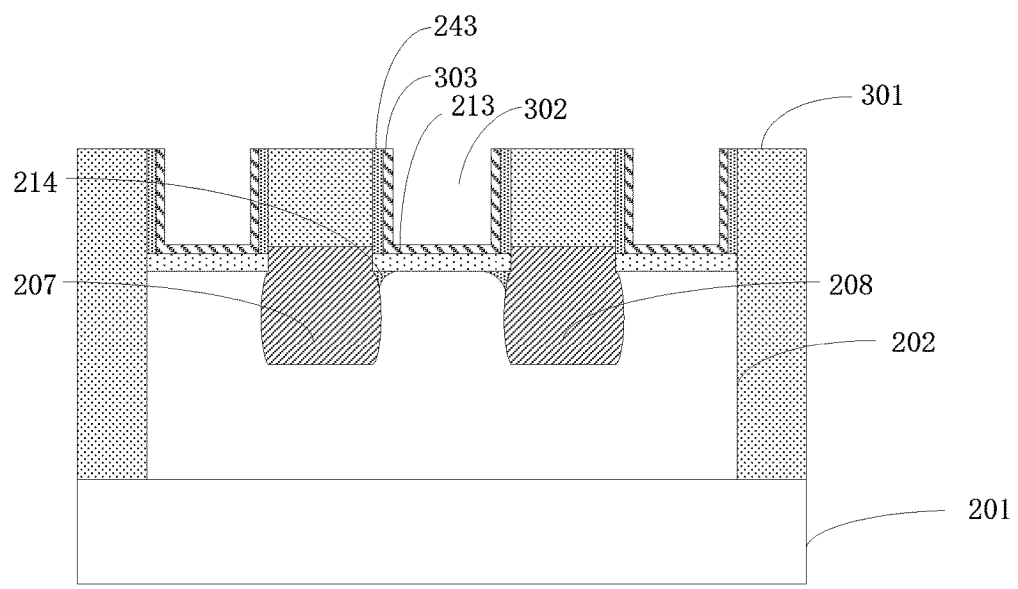

Subsequently, as shown in FIG. 9, a first high-K dielectric layer 303 is formed at a bottom portion of the first groove 302 (that is, over the first dielectric layer 213). Preferably, a first interfacial layer (not shown in the figure) may be first formed at the bottom portion of the first groove 302, and then the first high-K dielectric layer 303 is formed on the first interfacial layer, so as to improve interfacial properties between the first high-K dielectric layer 303 and the first dielectric layer 213. In addition, the first high-K dielectric layer 303 may further be formed at a side wall of the first groove 302. The material for the first high-K dielectric layer 303 may include, but is not limited to: La2O3, TiO2, Ta2O5, ZrO2, BaZrO, HfO2, HfZrO, HfZrON, HfLaO, HfSiO, HfSiON, LaSiO, AlSiO, HfTaO, or HfTiO.

Figure 10:
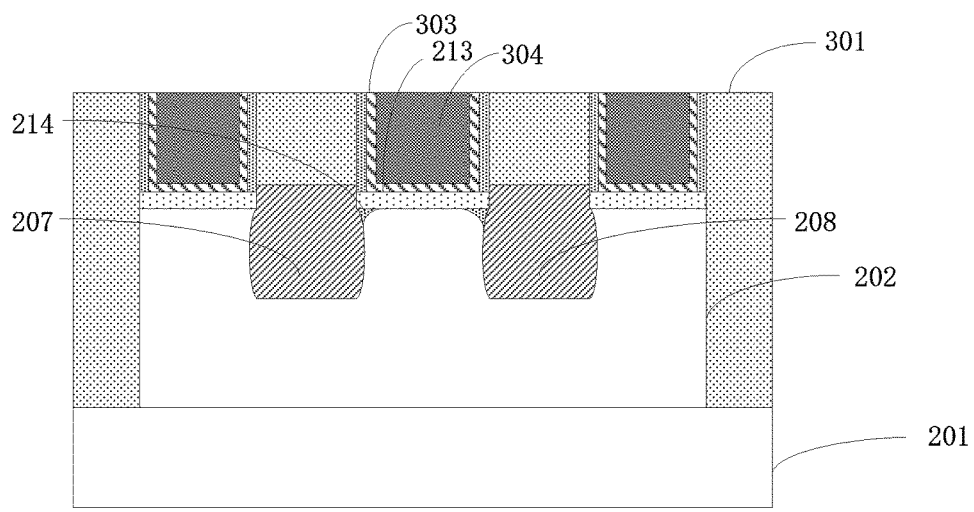

Subsequently, as shown in FIG. 10, a first gate 304 is formed on the first high-K dielectric layer 303 to fill the first groove 302. Herein, the material of the first gate 304 may be aluminum, tungsten, or other metal materials. For example, the first gate material may be deposited on a structure shown in FIG. 9, and then the planarization process is performed, so as to form the first gate 304.

After the first high-K dielectric layer 303 is formed, the first dielectric layer 213, a first portion 214 of a first oxide layer below the edges of the first dielectric layer 213, and the first high-K dielectric layer 303 together serve as a gate dielectric layer for the first gate 304 (referred to as a first gate dielectric layer hereinafter). A portion of the first gate dielectric layer abutting against a first drain region 208 may be referred to as a first region, a portion of the first gate dielectric layer abutting against a first source region 207 may be referred to as a second region, and a portion of the first gate dielectric layer between the first region and the second region may be referred to as a third region. Herein, the thicknesses of the first region and the second region are greater than the thickness of the third region.

Therefore the method in this implementation increases the thickness of a first gate dielectric layer between overlapping portions of a first drain region 208 and a first gate 304, so as to reduce a vertical electric-field strength, and decrease GIDL of the first electronic component.

FIG. 1 to FIG. 19 show schematic diagrams at all phases of another method for manufacturing a semiconductor device. Only differences between this method and the method shown in FIG. 2 to FIG. 7B are described below. Reference may be made to the descriptions above for similar steps.

Figure 11:
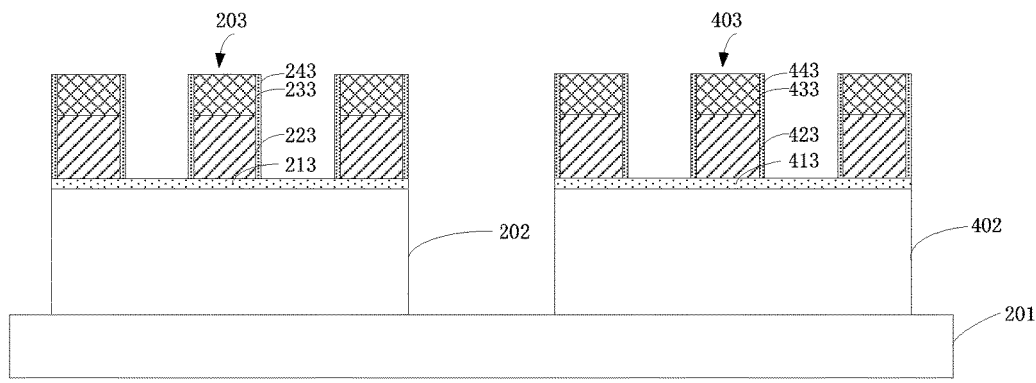
FIG. 11 to FIG. 19 show schematic diagrams at all phases of yet another method for manufacturing a semiconductor device.

First, as shown in FIG. 11, a substrate structure is provided. Compared with the substrate structure shown in FIG. 2, this substrate structure may further include a second fin 402 that is on a substrate 201 for forming a second electronic component, and a second pseudo gate structure 403 on a portion of the second fin 402. In some implementations, the second electronic component may include a kernel electronic component. A kernel electronic component may be used for general logic processing. A kernel electronic component device may operate at different voltage (e.g., lower voltage) than a I/O electronic component.

The second pseudo gate structure 403 may include a second dielectric layer 413 on a portion of the second fin 402 and a second pseudo gate 423 on the second dielectric layer 413. The second pseudo gate structure may also include a second hard mask layer 443 on the second pseudo gate 423 and a second spacer layer 443 at side walls of the second pseudo gate 423 and the second hard mask layer 443. The second pseudo gate structure 403 may be similar to the first pseudo gate structure 203, and materials used for the second pseudo gate structure 403 and the first pseudo gate structure 203 may be similar. For example, materials that may be used as the first dielectric layer 213 and the second dielectric layer 413 may be the same.

In addition, another pseudo gate structure may be formed at one or two end portions of the second fin 402. The pseudo gate structure may be the same as or similar to the second pseudo gate structure 403, and helps to control appearances of a second source region 407 and a second drain region 408 that are subsequently formed by epitaxy.

Figure 12:
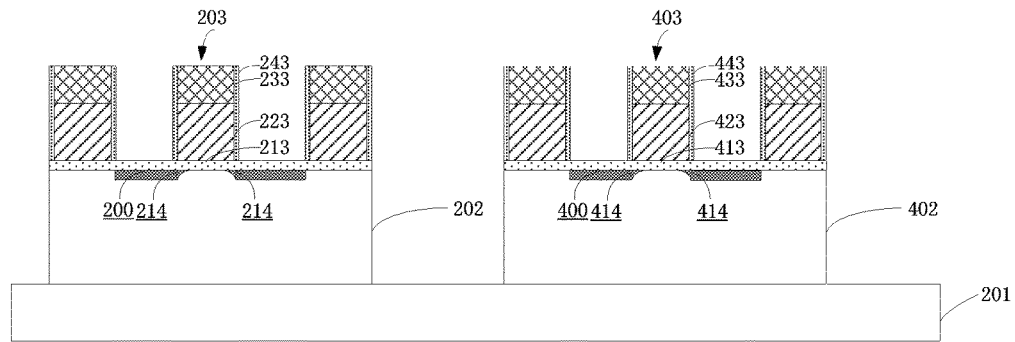

Subsequently, as shown in FIG. 12, an oxidization process is performed. The oxidization process not only forms a first portion 214 of a first oxide layer, but also oxidizes a surface of the second fin 402 below an edge of the second dielectric layer 413 and the second pseudo gate structure 403, so as to form a second oxide layer 414. It should be understood that the oxidization process further forms an oxide layer 400 at a surface of a portion of the second fin 402 not covered by the second pseudo gate structure 403, that is, a portion abutting against the second oxide layer 414 as shown in FIG. 12.

Figure 13:
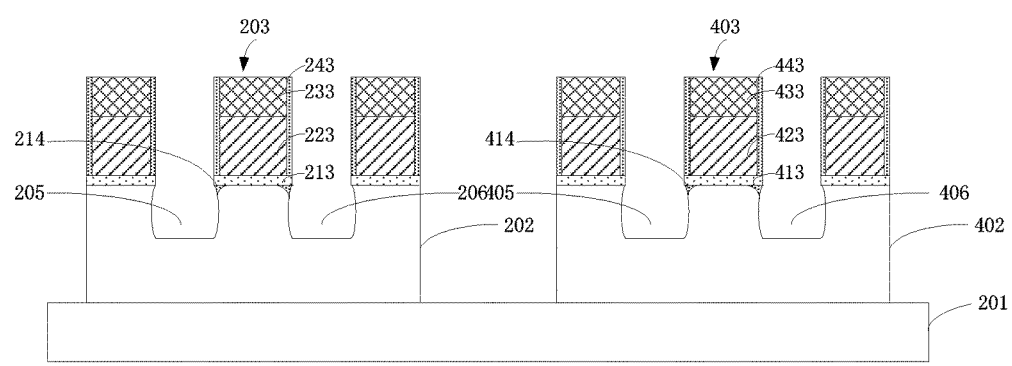

Subsequently, as shown in FIG. 13, an etching process is performed. The etching process in this implementation not only forms a first recess 205 and a second recess 206, but also removes a portion of the second fin 402 at a side surface of the second pseudo gate structure 403, so as to form a third recess 405 and a fourth recess 406.

Figure 14:
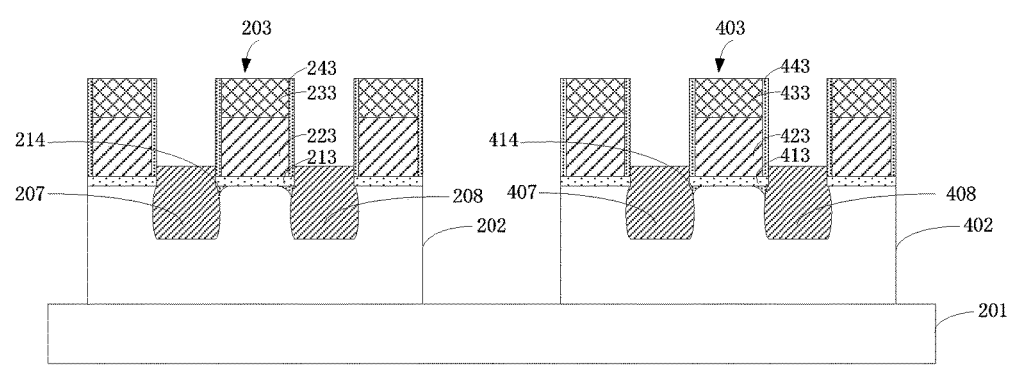

Subsequently, as shown in FIG. 14, an epitaxial process is performed. The epitaxial process not only forms a first source region 207 and a first drain region 208, but also epitaxially grows a semiconductor material in the third recess 405 and the fourth recess 406, so as to form the second source region 407 and the second drain region 408. The growth of the first, second, third, or fourth drain or source may rise above the first and second dielectric layer.

After the first source region 207, the first drain region 208, the second source region 407, and the second drain region 408 are formed, the first pseudo gate 223 and the second pseudo gate 423 may further be replaced with, for example, metal gates. Descriptions are made below with reference to FIG. 15 to FIG. 19.

Figure 15:
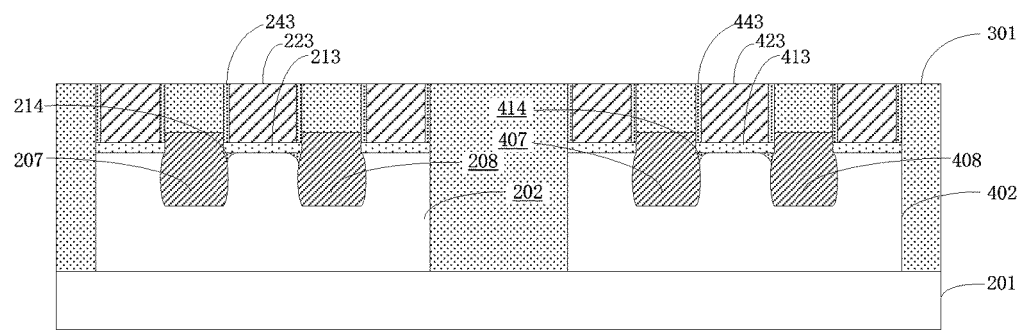

First, as shown in FIG. 15, an interlayer dielectric layer 301 is deposited and planarization is performed, so as to expose the first pseudo gate 223 and the second pseudo gate 423.

Figure 16:
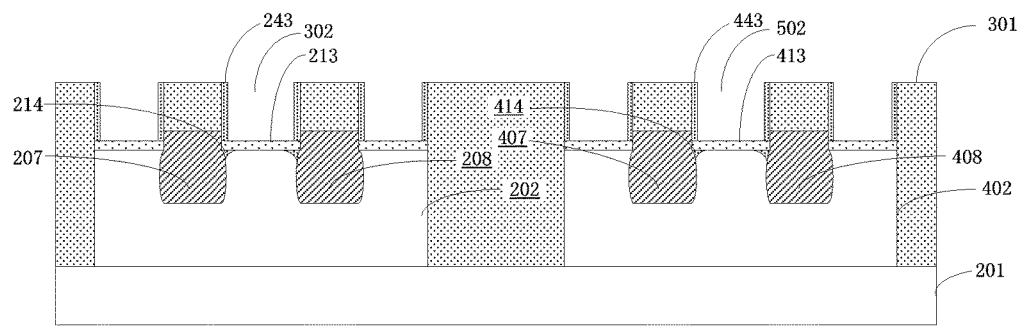

Subsequently, as shown in FIG. 16, the first pseudo gate 223 and the second pseudo gate 423 are removed, so as to form a first groove 302 for forming the first electronic component and a second groove 502 for forming the second electronic component.

Figure 17:
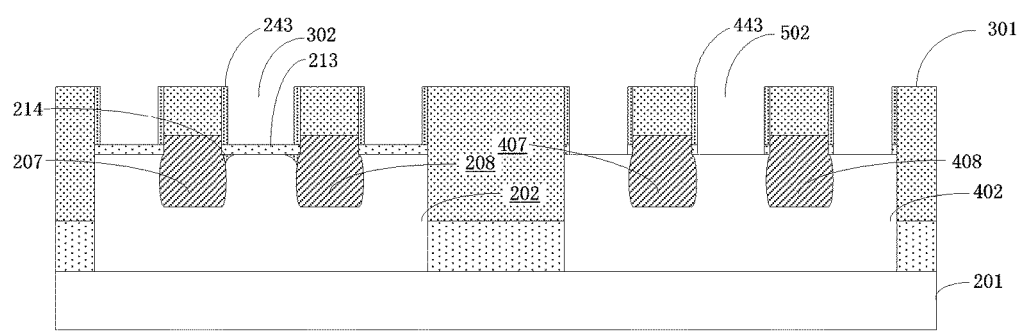

Subsequently, as shown in FIG. 17, the second dielectric layer 413 and the second oxide layer 414 below the edge of the second dielectric layer 413 are removed. It should be understood that in some cases, a portion of the second dielectric layer 413 that is below the second spacer 443 may be retained.

Figure 18:
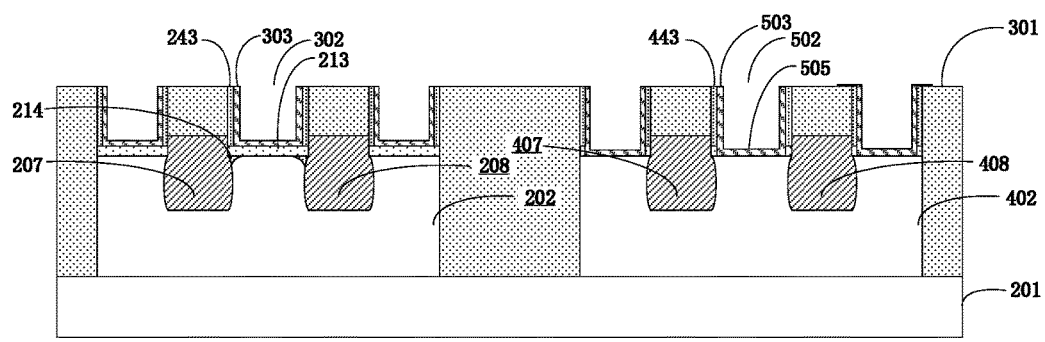

Subsequently, as shown in FIG. 18, a first high-K dielectric layer 303 is formed at a bottom portion of the first groove 302, and a second high-K dielectric layer 503 is formed at a bottom portion of the second groove 502. For the material of the second high-K dielectric layer 503, reference may be made to the foregoing examples of the material of the first high-K dielectric layer 303. Preferably, a first interfacial layer (not shown in the figure) may be first formed at the bottom portion of the first groove 302, and then the first high-K dielectric layer 303 is formed on the first interfacial layer. Preferably, a second interfacial layer 505 may be first formed at the bottom portion of the second groove 502, and then the second high-K dielectric layer 503 is formed on the second interfacial layer 505. In addition, the first high-K dielectric layer 303 may further be formed at a side wall of the first groove 302, and the second high-K dielectric layer 503 may further be formed at a side wall of the second groove 502.

Figure 19:
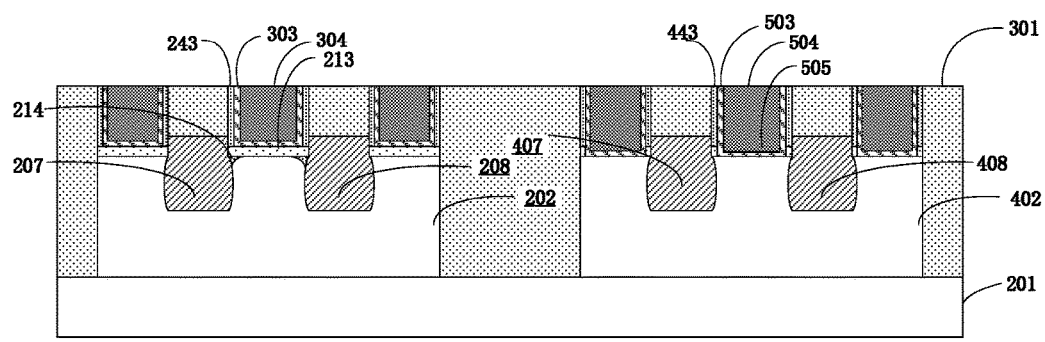

Subsequently, as shown in FIG. 19, a first gate 304 is formed on the first high-K dielectric layer 303 to fill the first groove 302. A second gate 504 is formed on the second high-K dielectric layer 503 to fill the second groove 502. The material for the second gate 504 may be a metal material that is same as or similar to the material for the first gate 304.

The method in this implementation forms two electronic components at the same time. A first dielectric layer 213, a first portion 214 of a first oxide layer below edges of the first dielectric layer 213 and the first gate structure, and a first high-K dielectric layer 303 serve as a gate dielectric layer for the first gate 304 (referred to as a first gate dielectric layer). A second high-K dielectric layer 503 serves as a gate dielectric layer for the second gate 504 (referred to as a second gate dielectric layer). This implementation increases the thickness of the first gate dielectric layer between overlapping portions of a first drain region 208 and the first gate 304, so as to reduce a vertical electric-field strength, and decrease GIDL of the first electronic component.

This disclosure further provides a semiconductor device, including:

a substrate 201, for example, a silicon substrate;

a first fin 202 that is on the substrate 201 for forming a first electronic component (for example, an I/O electronic component);

a first gate structure on a portion of the first fin 202, where the first gate structure may include a first gate dielectric layer on a portion of the first fin 202 and a first gate 304 on the first gate dielectric layer, and the first gate structure may also include a first spacer layer 243 at a side wall of the first gate 304; and a first source region 207 and a first drain region 208 that are at two sides of the first gate structure and that are at least partially located in the first fin 202. The first source region 207 and the first drain region 208 may be partially located in the first fin 202, and the other portions may protrude the first fin 202. That is, the first source region 207 and the first drain region 208 are raised source regions. Alternatively, the first source region 207 and the first drain region 208 may also be entirely located in the first fin 202.

Herein, a portion at which the foregoing first gate dielectric layer may include a first region abutting against the first drain region 208, a second region abutting against the first source region 207, and a third region between the first region and the second region. The thickness of the first region is greater than that of the third region, or the thicknesses of both the first region and the second region are greater than the thickness of the third region.

It should be understood that the boundaries between the first region, the second region, and the third region do not need to be precisely defined. The first region and the second region herein may be understood as an edge (end portion) portion of the first gate dielectric layer, and the third region may be an intermediate portion between two edge (end portion) portions.

In an implementation, with reference to FIG. 10, the first gate dielectric layer may include a first dielectric layer 213 on a portion of the first fin 202, a first high-K dielectric layer 303 above the first dielectric layer 213, and a first oxide layer. The first oxide layer may be implemented in different manners that are separately described below in detail.

As a specific implementation, with reference to FIG. 10, the first oxide layer may include a first portion 214 below edges of the first dielectric layer 213 and the first gate structure.

As another specific implementation, with reference to FIG. 4A, the first oxide layer may include the first portion 214, and may also include a second portion 224 below the dielectric layer 213 and between the edges of the first dielectric layer 213 and the gate structure. The thickness of the first portion 214 is greater than that of the second portion 224.

As still another specific implementation, with reference to FIG. 4B, the first oxide layer may include the first portion 214 and the second portion 224, and may also include a third portion 234 at the upper edges of the first dielectric layer 213 and the gate structure. Alternatively, the first oxide layer may include the first portion 214, and may also include the third portion 234 at the upper edges of the first dielectric layer 213 and the gate structure.

As yet another specific implementation, with reference to FIG. 4C, the first oxide layer may include the first portion 214, the second portion 224, and the third portion 234, and may also include a fourth portion 244 on upper side of a portion of the first dielectric layer 213 that is between the edges of the first dielectric layer 213 and the gate structure. Alternatively, the first oxide layer may include the first portion 214 and the third portion 234, and may also include the fourth portion 244 on the upper side of a portion of the first dielectric layer 213 that is between the edges of the first dielectric layer 213 and the gate structure. Herein, the thickness of the third portion 234 is greater than that of the fourth portion 244.

The four specific implementations of the first oxide layer that are described above may all enable the thickness of an edge portion of the first gate dielectric layer to be greater than that of an intermediate portion.

Preferably, the first gate dielectric layer may also include a first interfacial layer between the first dielectric layer 213 and the first high-K dielectric layer 303. In addition, the first high-K dielectric layer 303 may also be provided between the first gate 304 and the first spacer layer 243.

This disclosure further provides another semiconductor device. With reference to FIG. 19, compared with the implementation shown in FIG. 10, the device according to the implementation shown in FIG. 19 further includes a second fin 402 that is on the substrate 201 for forming a second electronic component (for example, a kernel component), a second gate structure on a portion of the second fin 402, and a second source region 407 and a second drain region 408 that are at two sides of the second gate structure and that are at least partially located in the second fin.

The foregoing second gate structure may include a second gate dielectric layer (for example, may be a second high-K dielectric layer 503) on a portion of the second fin 402 and a second gate 504 on the second gate dielectric layer. The second gate structure may also include a second spacer layer 443 at a side wall of the second gate 504. In addition, the second high-K dielectric layer 503 may also be provided between the second gate 504 and the second spacer layer 443. The second gate dielectric layer may also include a second interfacial layer 505 between a surface of a portion of the second fin 402 and the second high-K dielectric layer 503.

Heretofore, the semiconductor device and the manufacturing method therefor are described in detail. To avoid obscuring the idea of this disclosure, some details generally known in the art are not described. According to the foregoing descriptions, a person of ordinary skill in the art understand how to implement the technical solutions disclosed herein. In addition, the implementations disclosed in the specification may be f combined. A person of ordinary skill in the art should understand that various modification can be made to the implementations described above without departing from the scope and the spirit of this disclosure that are defined by the appended claims.

What is claimed is:

1. A semiconductor device, comprising:
    a substrate;
    a first fin that is on the substrate for forming a first electronic component;
    a first gate structure on a portion of the first fin, comprising:
        a first gate dielectric layer on a portion of the first fin; and
        a first gate on the first gate dielectric layer; and
    a first source region and a first drain region, each of which is positioned at one of two sides of the first gate structure and at least partially located in the first fin,
    wherein the first gate dielectric layer comprises:
        a first region abutting against the first drain region,
        a second region abutting against the first source region, and
        a third region between the first region and the second region, and
    wherein a thickness of the first region is greater than a thickness of the third region.

2. The semiconductor device according to claim 1, wherein a thickness of the second region is greater than the thickness of the third region.

3. The semiconductor device according to claim 1, wherein the first gate dielectric layer comprises:
    a first dielectric layer above a portion of the first fin;
    a first high-K dielectric layer above the first dielectric layer; and
    a first oxide layer, comprising:
        a first portion below edges of the first dielectric layer and the first gate structure.

4. The semiconductor device according to claim 3, wherein the first oxide layer further comprises:
    a second portion below the first dielectric layer and positioned between the edges of the first dielectric layer and the first gate structure,
    wherein the thickness of the first portion is greater than the thickness of the second portion.

5. The semiconductor device according to claim 3, wherein the first oxide layer further comprises:
    a third portion at upper edges of the first dielectric layer and the first gate structure.

6. The semiconductor device according to claim 5, wherein the first oxide layer further comprises:
    a fourth portion on a portion on an upper side of a portion of the first dielectric layer and positioned between the edges of the first dielectric layer and the first gate structure,
    wherein the thickness of the third portion is greater than a thickness of the fourth portion.

7. The semiconductor device according to claim 1, further comprising:
    a second fin on the substrate for forming a second electronic component;
    a second gate structure on a portion of the second fin, comprising:
        a second gate dielectric layer on a portion of the second fin; and
        a second gate on the second gate dielectric layer; and
    a second source region and a second drain region, each of which is positioned at one of two sides of the second gate structure and at least partially located in the second fin.

8. The semiconductor device according to claim 7, wherein the second gate dielectric layer comprises a second high-K dielectric layer.

9. The semiconductor device according to claim 7, wherein the first electronic component comprises an input/output electronic component, and the second electronic component comprises a kernel electronic component.

10. The semiconductor device according to claim 9, wherein the input/output electronic component is configured to operate at higher gate voltage than the kernel electronic component.

11. A method for manufacturing a semiconductor device, comprising:
    providing a substrate structure, wherein the substrate structure comprises:
        a substrate;
        a first fin that is on the substrate for forming a first electronic component; and
        a first pseudo gate structure on a portion of the first fin, the first pseudo gate structure comprising:
            a first dielectric layer on a portion of the first fin,
            a first pseudo gate on the first dielectric layer,
            a first hard mask layer on the first pseudo gate, and
            a first spacer layer located at side walls of the first pseudo gate and the first hard mask layer;
    performing an oxidization process, so as to oxidize the first fin below edges of the first dielectric layer and the first pseudo gate structure, thereby forming a first portion of a first oxide layer;
    performing an etching process after the oxidization process is performed, so as to remove a portion of the first fin that is at a side surface of the first pseudo gate structure, thereby forming a first recess and a second recess; and
    performing an epitaxial process, so as to epitaxially grow a semiconductor material in the first recess and the second recess, thereby forming a first source region and a first drain region.

12. The method according to claim 11, wherein the oxidization process further oxidizes the first fin that is below a portion between the edges of the first dielectric layer and the first pseudo gate structure, so as to form a second portion of the first oxide layer,
    wherein thickness of the first portion is greater than that of the second portion.

13. The method according to claim 11, wherein the oxidization process further oxidizes the first pseudo gate at upper edges of the first dielectric layer and the first pseudo gate structure, so as to form a third portion of the first oxide layer.

14. The method according to claim 13, wherein the oxidization process further oxidizes the first pseudo gate that is on upper side of a portion of the first dielectric layer and between the edges of the first dielectric layer and the first pseudo gate structure, so as to form a fourth portion of the first oxide layer, and wherein thickness of the third portion is greater than that of the fourth portion.

15. The method according to claim 11, wherein the oxidization process comprises a rapid thermal oxidization process, a furnace oxidization process, or an in-situ steam generation process.

16. The method according to claim 11, further comprising:
    depositing an interlayer dielectric layer and performing planarization after the epitaxial process is performed, so as to expose the first pseudo gate;
    removing the first pseudo gate, so as to form a first groove for forming the first electronic component;
    forming a first high-K dielectric layer at a bottom portion of the first groove; and
    forming a first gate on the first high-K dielectric layer, wherein the first dielectric layer, the first oxide layer, and the first high-K dielectric layer serve as a first gate dielectric layer for the first gate.

17. The method according to claim 11, wherein:
    the substrate structure further comprises a second fin on the substrate for forming a second electronic component and a second pseudo gate structure on a portion of the second fin, the second pseudo gate structure comprising a second dielectric layer on a portion of the second fin, a second pseudo gate on the second dielectric layer, a second hard mask layer on the second pseudo gate, and a second spacer layer located at side walls of the second pseudo gate and the second hard mask layer;
    the oxidization process further oxidizes the second fin below edges of the second dielectric layer and the second pseudo gate structure, so as to form a second oxide layer;
    the etching process further removes a portion of the second fin at a side surface of the second pseudo gate structure, so as to form a third recess and a fourth recess; and
    the epitaxial process further epitaxially grows a semiconductor material in the third recess and the fourth recess, so as to form a second source region and a second drain region.

18. The method according to claim 17, further comprising:
    depositing an interlayer dielectric layer and performing planarization after the epitaxial process is performed, so as to expose the first pseudo gate and the second pseudo gate;
    removing the first pseudo gate and the second pseudo gate, so as to form a first groove for forming the first electronic component and a second groove for forming the second electronic component;
    removing the second dielectric layer and the second oxide layer;
    forming a first high-K dielectric layer at a bottom portion of the first groove, and forming a second high-K dielectric layer at a bottom portion of the second groove; and
    forming a first gate on the first high-K dielectric layer, and forming a second gate on the second high-K dielectric layer,
    wherein the first dielectric layer, the first oxide layer, and the first high-K dielectric layer serve as a first gate dielectric layer for the first gate, and the second high-K dielectric layer serves as a second gate dielectric layer for the second gate.

19. The method according to claim 17, wherein the first electronic component comprises an input/output electronic component, and the second electronic component comprises a kernel electronic component.

20. The method according to claim 19, wherein the input/output electronic component is configured to operate at higher gate voltage than the kernel electronic component.

* * * * *